(12) United States Patent
Lesso (10) Patent No.: US 11,271,532 B1
(45) Date of Patent: Mar. 8, 2022

(54) AMPLIFIERS (71) Applicant: Cirrus Logic International Semiconductor Ltd., Edinburgh (GB)

(72) Inventor: John P. Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/997,409

(22) Filed: Aug. 19, 2020

(51) Int. Cl.
*H03F 3/217* (2006.01)
*H03F 3/181* (2006.01)

(52) U.S. Cl.
CPC ....... *H03F 3/2173* (2013.01); *H03F 2200/03* (2013.01); *H03F 2200/102* (2013.01); *H03F 2200/504* (2013.01)

(58) Field of Classification Search
CPC ............... H03F 3/2173; H03F 2200/03; H03F 2200/504; H03F 2200/102
USPC ........................................ 330/10, 207 A, 251
See application file for complete search history.

(56) References Cited

U.S. PATENT DOCUMENTS

2016/0360317 A1* 12/2016 Lee ................ H03F 3/68

FOREIGN PATENT DOCUMENTS

| EP | 0487133 A2 | 5/1992 |
| EP | 1487100 A1 | 12/2004 |
| EP | 1548933 A1 | 6/2005 |

OTHER PUBLICATIONS

International Search Report and Written Opinion of the International Searching Authority, International Application No. PCT/GB2021/051970, dated Oct. 7, 2021.
Elektor Electronics, "2 × 25 W Power Amplifier for Car Sound Systems High Efficiency with a TDAI563Q", vol. 27, No. 304, Nov. 2, 2001, pp. 62-65.

* cited by examiner

*Primary Examiner* — Hieu P Nguyen
(74) *Attorney, Agent, or Firm* — Jackson Walker L.L.P.

(57) ABSTRACT

This application relates to an amplifier selectively operable in first or second modes. The first mode is a BTL mode with first and second output drivers (103p, 103n) both active to generate respective driving signals that vary with an input signal. The second mode is an SE mode, where the first output driver (103p) is active to generate a driving signal at and the output of the second driver (103n) is held constant. A controller (201) selectively controls the mode based on an indication of output signal amplitude. In the first mode, a ratio of magnitude of the two driving signals varies with the indication of output signal amplitude, i.e. the magnitudes of the two driving signals may vary so as to be not equal.

18 Claims, 3 Drawing Sheets

AMPLIFIERS

TECHNICAL FIELD

The field of representative embodiments of this disclosure relates to methods, apparatus and/or implementations concerning or relating to amplifiers, in particular amplifiers for driving loads such as transducers.

BACKGROUND

Many electronic devices include amplifier circuits for generating driving signals for driving a transducer, for instance for driving audio signals into an audio output transducer such as a loudspeaker.

In some applications, the amplifier circuit may be configured to drive the transducer in a bridge-tied-load (BTL) configuration. In a BTL configuration, both sides of the load are driven with respective driving signals that are complementary to one another so as to apply the relevant driving voltage across the load.

Figure 1:
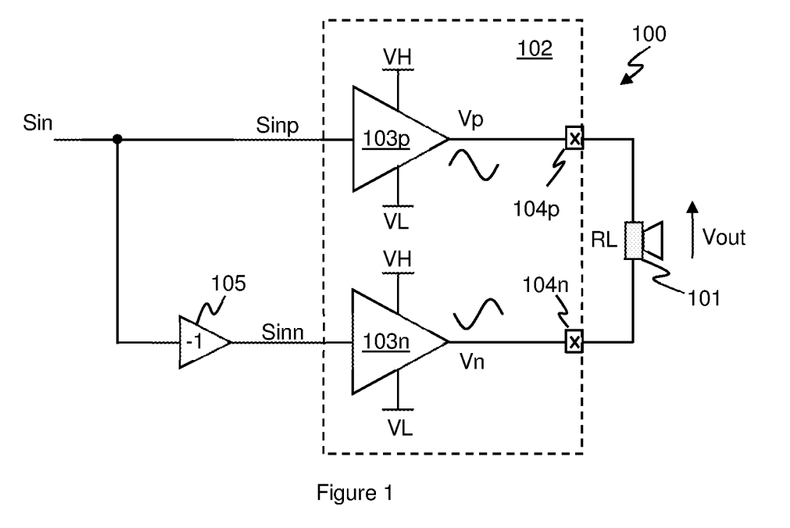
FIG. 1 illustrates one example of an amplifier circuit for driving a load in a bridge-tied load configuration.

FIG. 1 illustrates one example of an amplifier circuit 100 for driving a transducer 101, in this example a speaker, in a BTL configuration. FIG. 1 illustrates the amplifier circuit has an amplifier stage 102 that, in this example, comprises respective positive and negative drivers 103p and 103n for driving respective positive and negative output terminals 104p and 104n, coupled to opposite sides of the transducer 101, with complementary driving signals Vp and Vn, based on an input signal Sin, so as to apply an output signal Vout across the load 101.

In the example of FIG. 1, the amplifier stage 102 receives differential inputs, Sinp and Sinn, and amplifies these differential inputs to provide the differential driving signals Vp and Vn. In some implementations, the amplifier circuit 100 may receive an input signal Sin and derive the differential signals, Sinp and Sinn, therefrom, for instance as illustrated in FIG. 1 by using the input signal Sin as the positive signal component and providing an inverter 105 to invert the input signal Sin to provide the negative signal component Sinn. It will be understood, however, that other arrangements are possible or amplifier circuit 100 may receive a differential input.

Each of the positive and negative drivers 103p and 103n may be an amplifier which receives supply voltages VH and VL, which could, for instance, be a supply voltage and ground, or positive and negative supply voltages. In some applications the drivers 103p and 103n may be implemented as class-D amplifiers, which, as will be understood by one skilled in the art, may switch between the two supply voltages with a duty cycle based on the respective input Sinp or Sinn.

The BTL arrangement of the amplifier circuit 100 thus drives both side of the load, e.g. transducer 101, with driving voltages that vary with the input signal Sin. This can provide advantages in terms maximum power output compared to the alternative single-ended configuration, in which a variable driving voltage is applied to one side of the load transducer only, and the other side of the transducer is tied to a reference voltage, which for audio transducers and the like, is a midpoint voltage.

In a BTL configuration one side of the load may be driven to near VH (less appropriate headroom) whilst the other side of the load may be to near VL. Thus, the maximum magnitude of the output voltage could be close to the magnitude of the supply voltage, i.e. VH−VL. In a single-ended configuration one side of the load is held at a midpoint voltage, and thus the maximum magnitude of the output voltage is equal to half the magnitude of the supply voltage (less headroom).

In at least some applications it may be desirable for the amplifier circuitry to be operable to drive transducers with relatively high power driving voltages, and thus a BTL configuration may be implemented.

In at least some applications, however, power efficiency is also desirable, especially for portable and/or battery powered devices, where power consumption is an important consideration for operating life.

SUMMARY

Embodiments of the present disclosure relate to improved amplifier arrangements and methods of amplification. Embodiments may, in particular, relate to an amplifier arrangement operable in a BTL configuration but which may offer power efficiency advantages.

According to an aspect of the disclosure there is provided an amplifier circuit for generating an output signal between first and second output nodes based on a received input signal, the amplifier circuit comprising:

first and second output drivers; and a controller for selectively controlling the amplifier circuit in a first mode or a second mode based on an indication of output signal amplitude; wherein:

in the first mode the first and second output drivers are both active to generate respective first and second driving signals that each vary with the input signal at the first and second output nodes respectively; and in the second mode the first output driver is active to generate a first driving signal at the first output node that varies with the input signal and the second output node is held at a constant voltage;

and wherein in the first mode a ratio of magnitude of the second driving signal compared to magnitude of the first driving signal varies with the indication of output signal amplitude.

In some examples the controller is configured such that, when operating in the first mode, the ratio of magnitude of the second driving signal compared to magnitude of the first driving signal varies within a range from zero to one and increases with increasing indication of output signal amplitude. The controller may be configured to, in the first mode, minimise the ratio of magnitude of the second driving signal compared to the magnitude of the first driving signal.

In some example the first output driver is located in a first signal path and the second output driver is located in a second signal path and the controller may be configured to control the ratio of magnitude of the second driving signal compared to magnitude of the first driving signal by controlling gains applied in the first and second signal paths.

In some examples the indication of output signal amplitude comprises a gain setting indicating a gain to be applied by the amplifier circuit.

Additionally or alternatively, in some examples the indication of output signal amplitude comprises an indication of amplitude of the input signal. In which case, the controller may comprise an envelope detector configured to receive a version of the input signal and determine the amplitude of the input signal. The amplifier circuit may comprise at least one element having a propagation delay located in a signal path upstream of at least one of the first and second output drivers and the envelope detector may receive the version of the input signal from upstream of the delay element.

In some examples the controller may be further configured to selectively control a bias applied to at least the first output driver based on the indication of the amplitude of the output signal. The controller may be configured such that a lower bias current is applied to the first output driver in the second mode than in the first mode. The controller may be configured such that a bias current applied to the first output driver in the first mode increases with increasing output signal amplitude.

In some examples the amplifier circuit may comprise a voltage regulator which is activate in the second mode to regulate the voltage at the second output node. The voltage regulator may comprise at least one of: a DC-DC converter and a charge pump.

In some examples the controller may be configured to disable the second output driver when operating in the second mode.

In some examples the first and second output drivers each comprise a respective class-D amplifier.

The amplifier circuit may, in use, further comprise a load transducer coupled between the first and second output nodes. In some examples, the load transducer may comprise a loudspeaker.

Aspects also relate to an electronic device comprising the amplifier circuit of any of the embodiments described herein.

In a further aspect there is provided an amplifier circuit for generating an output signal between first and second output nodes based on a received input signal, the amplifier circuit comprising:

first and second output drivers;

the amplifier circuit being operable in a first mode in which the first and second output drivers are both active to generate respective first and second driving signals that each vary with the input signal at the first and second output nodes respectively; and wherein, in the first mode, a ratio of magnitude of the second driving signal compared to magnitude of the first driving signal varies with an indication of output signal amplitude.

In a further aspect there is provided an amplifier circuit comprising:

a first signal path comprising a first amplifier;
a second signal path comprising a second amplifier; and
a controller for selectively operating the circuit in:
a first mode, in which both the first amplifier and second amplifier are active to drive first and second output nodes with respective first and second driving signals that each vary with the input signal; and
a second mode in which the first amplifier is active to drive the first output node with the first driving signal that varies with the input signal and the second output node is held at a constant voltage;

wherein the controller operates in the first mode when an indication of output signal amplitude is within a first range and where the controller controls a gain of the second path to reduce with reducing indication of output signal amplitude over said first range whilst maintain or increasing a gain of the first path.

In a further aspect there is provided an amplifier circuit comprising:

a first signal path comprising a first amplifier;
a second signal path comprising a second amplifier; and
a controller for selectively operating the circuit in:
a first mode, in which both the first amplifier and second amplifier are active to drive first and second output nodes with respective first and second driving signals that each vary with the input signal; and
a second mode in which the first amplifier is active to drive the first output node with the first driving signal that varies with the input signal and the second output node is held at a constant voltage; and wherein in the first mode a gain of the first signal path is controlled to be constant at a first value and a gain of the second signal path is selectively variable within a range of gain values up to said first value based on a gain control signal; and in the second mode the gain of the first signal path is selectively variable within a range of gain values up to said first value based on gain control signal.

Unless expressly indicated to the contrary, any of the various features of the various implementations discussed herein may be implemented together with any one or more of the other described features in any and all suitable combinations.

BRIEF DESCRIPTION OF DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above with reference to FIG. 1, a bridge-tied-load (BTL) configuration may be used in some applications to drive a load, such as a transducer. In a BTL configuration both side of the load transducer are driven with driving signal. Thus with two drivers 103p and 103n receiving supply voltages VH and VL, one side of the transducer can be driven to near VH whilst the other side of the transducer is driven to near VL (less amplifier headroom), thus applying almost the full voltage magnitude |VH−VL| across the load transducer as the output signal Vout. For a single-ended driving configuration one side of the transducer is held at a midpoint voltage Vmid, equal to (VH−VL)/2, and thus the maximum voltage of the output signal that can be applied is near half the full voltage magnitude of the difference between the supply voltages (again less headroom). The BTL configuration can thus be advantageous for driving a load with a higher power driving signal than a single-ended configuration for a given voltage supply.

However, whilst a BTL configuration can be advantageous to provide an output driving signal with an amplitude that is a significant proportion of the supply voltage, at lower output signal levels a BTL configuration may be relatively inefficient in terms of power efficiency. In general, as will be understood by one skilled in the art, the efficiency of a linear amplifier may be characterised as being proportional to Vsig/Vdd, where Vsig is amplitude of the output of the amplifier and Vdd is the magnitude of the supply voltage (i.e. VH−VL). In general, therefore, any amplifier where the output amplitude is significantly lower than the supply voltage is operating inefficiently, but for the BTL configuration as each output driver 103p and 103n generates a driving signal Vp or Vp with half the amplitude of the overall driving signal.

Also, a BTL amplifier circuit may also be implemented with class-D amplifiers for the drivers 103p and 103n. Class-D amplifiers operate to switch between the supply voltages with a duty-cycle controlled based on the input signal. Switching losses mean that class-D amplifiers are relatively inefficient at low power signal levels.

Embodiments of the present disclosure relate to amplifier circuitry and methods of operation thereof, where the amplifier circuitry comprises an output stage that is operable in a BTL configuration to drive a load, but which is also operable in a single-ended mode of operation and which is configured to dynamically transition between the modes of operation in use. The mode of operation may be controlled based on an indication of the output signal amplitude.

If the indication of output signal amplitude indicates that the required output signal amplitude is relatively low, and within the output range of just one of the drivers, then the amplifier circuit may operate in the single-ended mode. In this mode, one of the drivers of the output stage provides a driving signal which provides the full voltage excursion for the required output signal, with respect to a defined quiescent voltage level, typically a midpoint voltage Vmid. The other driver may then be disabled and the voltage at the relevant output may be held at the midpoint voltage. Disabling one of the drivers and using the other to provide the full voltage excursion thus increases the efficiency of the amplifier circuit and, where the drivers are class-D amplifiers, avoid the switching losses associated with one of the drivers.

If, however, the indication of output signal amplitude indicates that the required output signal could exceed the output range of just one of the drivers, then the amplifier circuit can operate in a BTL configuration and apply time-varying driving signals based on the input signal to both sides of the load.

Figure 2:
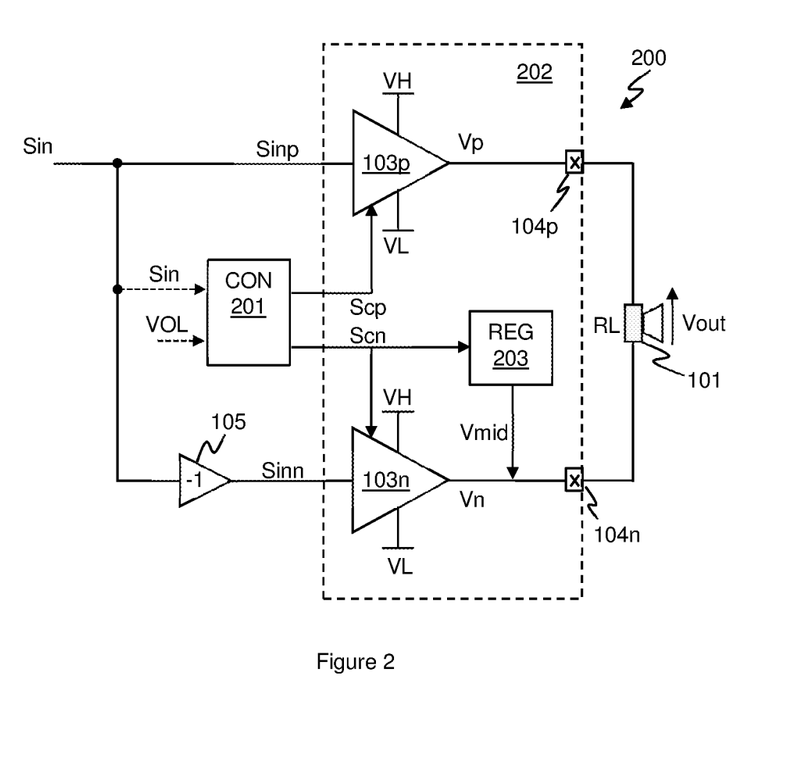
FIG. 2 illustrates one example of an amplifier circuit according to an embodiment.

FIG. 2 illustrates an example of an amplifier circuit 200 according to an embodiment, in which similar components to those discussed with reference to FIG. 1 are identified using the same reference numerals.

The amplifier circuit 200 of FIG. 2 comprises an amplifier stage 202. The amplifier stage 202 has output terminals 104p and 104n for connecting, in use, to both side of a load 101, which may, for example, be an audio output transducer such as a loudspeaker. The amplifier stage 202 comprises drivers 103p and 103n operable to generate respective driving signals Vp and Vn at the respective output nodes 104p and 104n. The drivers 103p and 103n may each comprise a class-D amplifier or driver.

The amplifier circuit 200 according to an embodiment also comprises a controller 201 for controlling a mode of operation of the circuit, e.g. of the amplifier stage 202. The controller 201 may be operable to selectively control the circuit 200 in a first mode, which may be referred to as a BTL (bridge-tied-load) mode. In the first mode both the drivers 103p and 103n may be operable to generate respective driving signals based on the input signal Sin. Thus, in first or BTL mode of operation, the voltages Vp and Vn at both output nodes 104p and 104n may vary with the input signal Sin. The voltage Vp and Vn may vary inversely from one another with respect to the midpoint voltage, but as will be described below, may vary asymmetrically or unequally.

The controller 201 is also operable to selectively control the circuit in a second mode, which may be referred to a SE (single-ended) mode. In the second mode, a driving signal based on the input signal Sin is generated at one of the output nodes only, and the other output node is held substantially constant, generally at a voltage which corresponds to the quiescent level of the driving signal, e.g. a midpoint voltage Vmid.

In the example of FIG. 2, the driver 103n may be deactivated or disabled in the second (SE) mode of operation and the voltage at output node 104n held at the midpoint voltage Vmid, e.g. by activating a voltage regulator 203 as will be discussed in more detail below. In this mode, the voltage Vp at output node 104p may thus vary with the input signal Vin, but the voltage Vn at the output node 104n may be held substantially constant.

The controller 201 may generate one or more control signals Scn for controlling whether or not the driver 103n is enabled and whether the voltage regulator 202 is active or not. The control signal(s) Scn may also control one or more parameters of the negative signal path of the amplifier stage 102 when active in the BTL mode, in particular a gain applied in the negative signal path. The controller may also generate at least one control signal Scp control one or more parameters of the positive signal path, in particular a gain applied in the positive signal path. In some embodiments the controller 201 may also control a level of bias applied to at least the driver 103p.

The controller 201 is configured to selectively control the mode of operation, i.e. BTL or SE mode, based on an indication of the amplitude of the output signal Vout. The controller 201 may be configured to operate in the SE mode if the indication of the amplitude of the output signal Vout indicates that the required voltage excursion for the output signal Vout may be generated using just the driver 103p.

For instance, consider that each of the drivers 103p and 103n are operable to generate a driving signal Vp or Vn in an output range of 0V to +1.0V. It will of course be understood that this output range is chosen merely as an illustrative example. In the BTL mode of operation the output signal Vout may vary between +1.0V (with Vp=+1.0V, Vn=0V) and −1.0V (Vp=0V, Vn=+1.0V). The quiescent signal level, Vout=0V, in this example corresponds to Vp=Vn=Vmid=0.5V.

In the SE mode the voltage Vn would be held at Vmid=0.5V. In this mode the output signal Vout may vary between +0.5V (with Vp=+1.0V) and −0.5V (with Vp=0V).

Thus, if the indication of the output signal amplitude indicates that, for this example, the amplitude of the output signal will be below 0.5V, the controller may be configured to control the circuit in the SE mode of operation, with the voltage Vn at the output node 104n held substantially constant, e.g. by regulator 203. This may allow driver 103n to be disabled or suspended.

If, however, the indication of the output signal amplitude indicates that the output signal amplitude is, or may be, above 0.5V, then the circuit may operate in the BTL mode of operation and the driver 103n may be enabled so that the voltage Vn at the output node 104n also varies with the input signal Sin to provide the required output signal Vout.

In some examples the indication of the output signal amplitude may be an indication of an overall gain to be applied by the amplifier circuit between the input signal Sin and the output signal Sout, e.g. a system or user controlled volume setting VOL or the like.

The volume setting may define the maximum voltage excursion, i.e. maximum amplitude, of the output signal Vout for a full-scale input signal. For example, consider that amplifier circuit 200 has a controllable volume in the range 0 to 1 that defines the ratio between the input signal (normalised within the available input signal range) and the output signal (normalised within the available output signal range). If the volume setting were set to 1, then a full-scale input signal could lead to a full-scale output signal, which would require BTL operation. However, at a volume setting below 0.5, even a full-scale input signal may use less than half of the available output range. Such a volume setting could thus be used to control the mode of operation and, as illustrated in FIG. 2, the controller may receive a volume signal VOL indicating the volume setting. Note in this case the volume setting is effectively used as an indication of the what the output signal amplitude could be, for a full-scale input signal.

In some examples, however, the indication of the amplitude of output signal may be an indication of the amplitude of the input signal. In some examples the controller may determine such an indication of amplitude from the input signal. The output signal Vout is generated based on the input signal Sin and thus the level of the input signal, together with the overall gain of the amplifier circuit, defines the level of the output signal.

The controller 201 may thus be configured to receive a version of the input signal Sin and may determine an amplitude or envelope value for the input signal.

Figure 3:
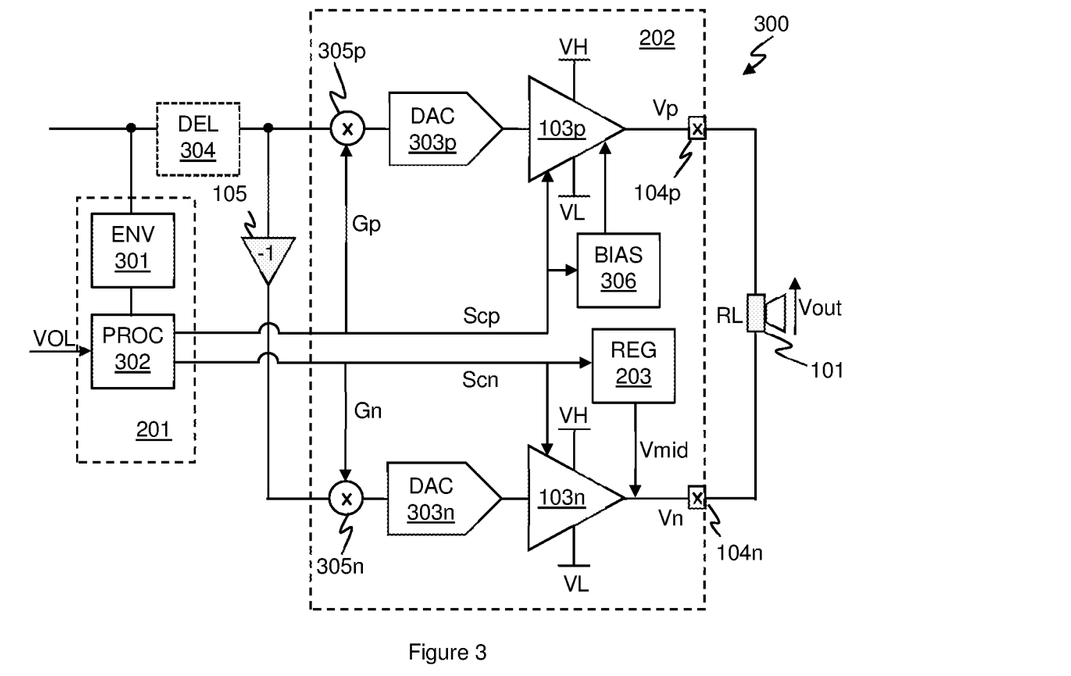
FIG. 3 illustrates another example of an amplifier circuit according to an embodiment.

FIG. 3 illustrates an example of an amplifier circuit 300 according to an embodiment which shows that the controller 201 receives a version of the input signal Sin. In this example the controller 201 comprises an envelope detector 301 which generates an indication of the envelope or amplitude of the input signal Sin.

In some examples the envelope detector 301 may comprise a peak detector that determines the peak absolute magnitude values of the input signal as it varies, within some defined time frame. The indication of the peak absolute magnitude could be used directly as an indication of the signal amplitude or envelope, but in some implementations the envelope detector 301 may comprise an envelope tracker configured to track the envelope or amplitude value of the input signal. The envelope tracker may have a fast attack time constant, so as to respond rapidly to any increases in signal amplitude, but may have a slower decay time constant so as to avoid rapid variations in envelope level.

It will be understood that envelope trackers and the like are used to determine input signal amplitude in other applications, for instance for control of supply voltages in class G amplifiers, or for gain control for dynamic range extension for ADCs and DACs. Any of the signal monitoring techniques or apparatus used for such other applications could be employed in embodiments of the present disclosure to monitor the input signal and the amplitude thereof.

The indication of the amplitude of the input signal Sin may be supplied to a processor 302 of the controller 201 which is configured to determine the mode of operation of amplifier circuit based on the amplitude level. For example, if the amplitude of the input signal is below a threshold, which means that the output signal is within the output range of driver 103p, then the processor 302 may operate the circuit in the SE mode, with the driver 103n disabled and the regulator 203 activated to maintain the voltage Vn at the output node at the midpoint voltage. If, however, the amplitude of the input signal increases above such a threshold, then the processor 302 may operate the circuit in the BTL mode and activate the driver 103n and deactivate the voltage regulator 203.

In some embodiments, if any variable gain is applied downstream of where the input signal Sin is monitored, for instance some user or system controlled volume VOL, the processor 302 may take such gain or volume into account in determining the mode of operation.

To allow the controller 201 time to determine the amplitude level of the input signal and the required operating mode and have sufficient time to active the driver 103n, when switching from the SE to BTL mode of operation, or activate the regulator 203, when switching from BTL to SE mode, the controller 201 may be implemented as part of a look-ahead arrangement. The controller 201 may thus be configured to monitor the input signal Sin before some element in the downstream signal path with a signal path propagation delay or latency, so that the controller 201 has time to react to any change in signal amplitude before that change in signal amplitude has propagated to the drivers 103p and 103n. FIG. 3 illustrates that the amplifier stage 202 comprises at least one DAC (digital-to-analogue converter) and, in the example of FIG. 3, there are respective DACs 303p and 303n in each of the positive and negative signals paths of the amplifier stage 202 so as to provide respective analogue input signals for the drivers 103p and 103n. There will be some processing delay or latency associated with the DACs 303p and 303n, e.g. due to interpolation, sample-rate conversion etc. By monitoring the input signal prior to the DACs 303p and 303n, the controller 201 may exploit some inherent delays in the main signal path to provide at least part of a look ahead, as well as allowing the controller 201 to monitor the input signal Sin in the digital domain. A DAC is just one example of an element with a signal path propagation latency however, and there may be additional and/or alternative delay elements in the signal path, which could include at least one dedicated delay element 304 that is present only to provide a suitable propagation delay.

In order to change the mode of operation, the controller 201 can enable or disable the driver 103n whilst also deactivating or activating the regulator 203. For a class-D amplifier the driver may be disabled by stopping switching of the output stage of the class-D amplifier. In some examples various parts of the class-D amplifier may be powered down when the driver 103n is disabled, although some parts of the class-D amplifier may be kept powered so as to allow the amplifier to be enabled more quickly when required.

In addition, the controller 201 may control the conversion gains of the positive and/or negative signal paths of the amplifier stage 202. Advantageously the controller may be operable so that, when operating in the BTL mode, different gains may be applied in the positive and negative signal paths of the amplifier stage depending on the indication of output signal amplitude. In other words, when operating in the BTL mode the magnitude of the positive and negative driving signals may be different from one another depending on the indication of signal amplitude. This is different to conventional BTL operation, where the positive and negative driving signals would be equal and opposite from one another. Varying the gains applied in the positive and negative signal paths of the amplifier stage 202, and hence the relative magnitudes of the voltages Vp and Vn, and hence their relative contribution to the output signal Vout, can be advantageous in transitioning between the modes of operation.

Consider the amplifier circuit 300 is operating in the BTL mode and the input signal Sin has a certain signal level, say S1. In the BTL mode, the voltage Vp depends on the input signal Sin, so the driving voltage Vp is equal to Gp*S1, where Gp is the gain of the positive signal path. Equally, in the BTL mode, the voltage Vn depends on the input signal Sin, so the driving voltage Vn is equal to −Gn*S1, where Gn is the gain of the negative signal path. The output signal Vout is equal to Vp−Vn=(Gp+Gn)*S1.

Conventionally, in BTL operation the positive and negative driving voltages are equal and opposite, i.e. Vp=Vn, and thus the positive and negative signal paths have the same gain as one another, i.e. Gp=Gn.

In the SE mode, however, the voltage Vn at the output node 104n is held constant at Vmid. Thus, the gain Gn of the negative path is effectively zero. In this mode the driver 103p must generate the driving signal Vp to provide all the required voltage excursion of the output signal Vout, rather than just half the voltage excursion as in conventional BTL operation. If the controller were to swap between an SE mode of operation, where the driving signal Vp provides all the required voltage excursion, to a conventional BTL mode where the driving signals Vp and Vn are equal and opposite, this would require a step change in gain in both the positive and negative signal paths on a change of mode, which may result in unwanted artefacts or the like.

In embodiments of the present disclosure, the controller 201 may control the amplifier stage 202 in the BTL mode so that the contribution to the output signal from the positive and negative signals paths are unequal, for at least some indications of output signal amplitude. In particular, the controller 201 may be operable, in the BTL mode, to reduce the relative contribution to the output signal of the voltage Vn at the output node 104n (i.e. the voltage that will be held constant in the SE mode) for lower amplitudes of the output signal. In essence, as the indication of the amplitude of the output signal decreases, the relative contribution to the output signal from the voltage Vn, compared to the voltage Vp, may be reduced. This means that the voltage excursion of Vn around Vmid will be reduced (possibly with a consequent increase in the voltage excursion of Vp to maintain a desired output signal Vout) as the indication of the output signal amplitude decreases. If the indication of output amplitude then decreases to a level where the amplifier circuit can operate in SE mode, there will thus already be little contribution to the output signal Vout from the voltage Vn and most of the output signal will be due to Vp.

The amplifier circuit may thus operate in the SE mode for a first range of output signal amplitudes and operate in the BTL mode for a second, higher, range of signal amplitudes. The controller 201 may control the contribution from the positive and negative signals path so that the contribution from one of the signal paths approaches zero as the indication of output signal amplitude approaches the bottom of the second range. This can aid in transitioning between modes.

The controller 201 may thus be configured to, when operating in the BTL mode, control the circuit such that a ratio of magnitude of the negative driving signal compared to magnitude of the positive driving signal varies with the indication of output signal amplitude. That is, the ratio |Vn−Vmid|/|Vp−Vmid| varies with the indication of signal amplitude.

Figure 4:
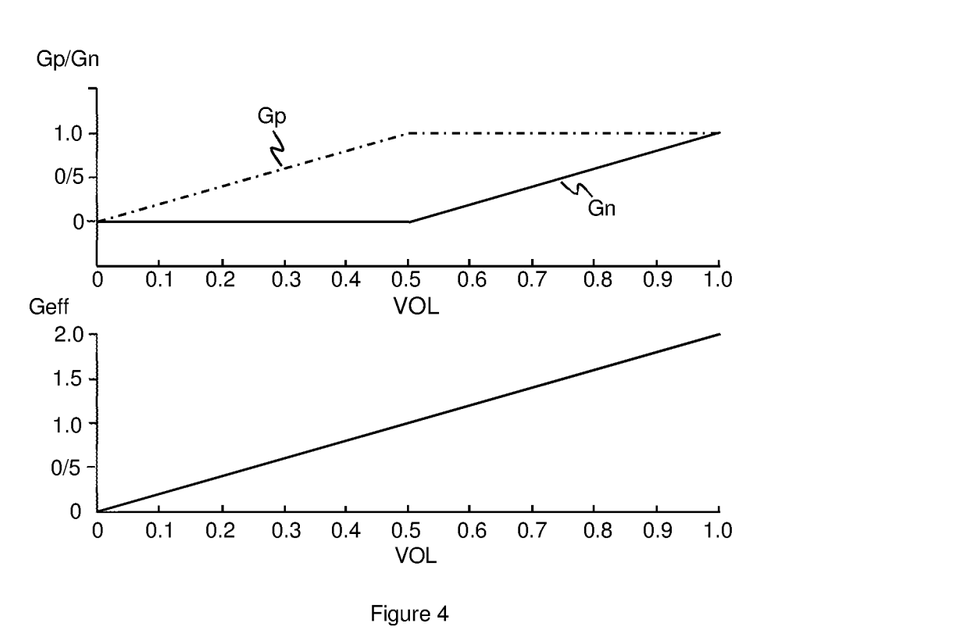
FIG. 4 illustrates one example of how the gains of the positive and negative paths of the amplifier circuit may be controlled.

FIG. 4 illustrates one example of how the contributions from the positive and negative signals paths may be controlled, e.g. based on a volume setting, to achieve a desired overall effective gain. The top plot of FIG. 4 illustrates how the gains Gp and Gn of the positive and negative signal paths may be controlled based on the volume setting, and the lower plot shows the effective gain of the amplifier circuit. FIG. 4 illustrates normalised values, i.e. the gains Gp and Gn are normalised in a range of 0 to 1, where a gain of 1 corresponds to a full-scale input signal leading to a full-scale driving signal from the relevant driver 103p or 103n. The effective gain of the amplifier circuit, which is equal to Gp+Gn, is thus illustrated in the range of 0 to 2. The indication of amplitude is also normalised in the range of 0 to 1, where 1 corresponds to the maximum.

If the volume setting is at the maximum value of 1, then a full-scale input signal could lead to a full-scale output signal. In this case, therefore, the gains Gp and Gn are both at maximum. In this operating state the circuit is operating in a conventional BTL mode and the variation of voltages Vp and Vn from the midpoint voltage will be opposite and equal, i.e. the ratio |Vn−Vmid|/|Vp−Vmid| would be equal to 1.

However, if the volume setting is reduced, the gain Gn is reduced, whilst, as far as possible, keeping the gain Gp at maximum. Thus, as the volume setting decreases, in the range of 1 to 0.5, the gain Gn is reduced accordingly. The contribution to output signal Vout from the voltage Vn thus also reduces. The ratio of |Vn−Vmid|/|Vp−Vmid| thus drops to be lower than 1.

At a volume setting of 0.5, the gain Gn is reduced to zero. At this point the output variation due to a full-scale input signal can be provided by driver 103p alone. The circuit can thus switch to the SE mode of operation of disable the driver 103n. It will be noted that at this point the driver 103p is already providing the whole voltage variation for the output signal Vout and thus no change in gain for the positive signal path is needed.

If the volume setting were to be reduced further, the gain Gp could be reduced to provide the required volume control.

Figure 5:
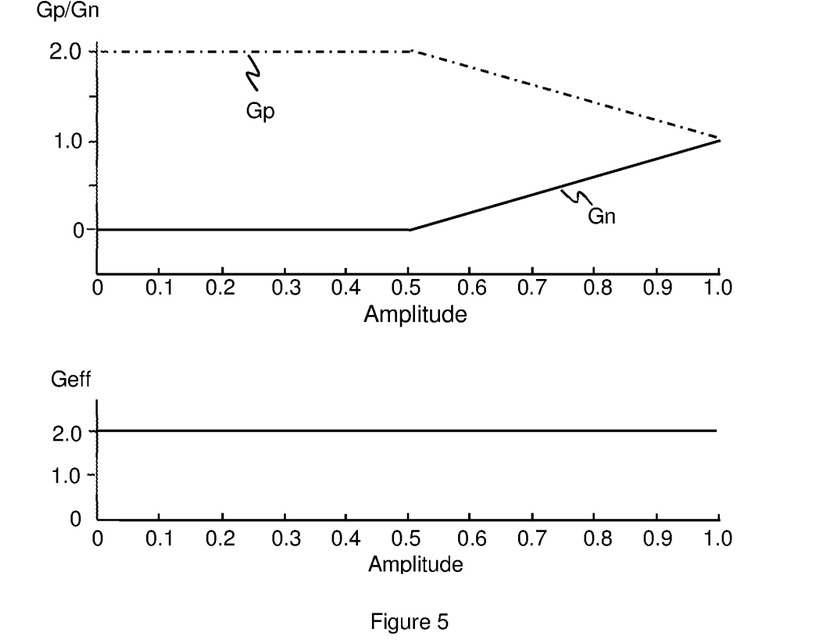
FIG. 5 illustrates another example of how the gains of the positive and negative paths of the amplifier circuit may be controlled.

FIG. 5 illustrates alternatively how the gains of the positive and negative signals paths may be varied based on the indication of the required output signal amplitude and may vary with the required signal amplitude so as to maintain a constant effective gain across the range of signal amplitudes. In this case the amplitude can be seen the input signal amplitude (assuming any volume controlled gain has already been applied).

If the input signal amplitude is less than 0.5, the required output signal can be generated by the positive driver 103p alone and the circuit may operate in the SE mode. The gain Gn of the negative signal path is thus 0. For the normalised range of input signal amplitudes from 0 to 0.5, the gain of the positive signal path may be fixed at a level that means that an input signal amplitude of 0.5 corresponds to a full-scale output from the driver 103p. For the purposes of illustration the gain Gp in FIG. 5 is thus represented as being 2.0 in this range.

If the input signal amplitude is greater than 0.5, the driver 103p cannot generate the corresponding output signal on its own, and thus the amplifier circuit switches to BTL mode. The gain Gp of the positive signal path is reduced, to avoid clipping, but rather than simply set the gains Gp to be equal, the gain Gp is reduce only to the extent necessary to avoid clipping and the gain Gn is increased by a corresponding amount so that the overall gain is constant. If the signal amplitude increases further, the gain Gp is reduced further, with a consequent increase to the gain Gn, until for a signal amplitude of 1.0, the gains Gp and Gn are equal and the circuit is operating in a conventional BTL mode.

This means that, in the BTL mode, as the signal amplitude decreases, the relative contribution to the output signal from the voltage Vn becomes less and less, compared to Vp, until the point is reached where the negative signal path contributes nothing and the circuit can enter the SE mode.

Thus, for example, consider the example described above where the output range of each driver 103$p$ and 103$n$ is from 0V to 1V. If the output signal were required to have an amplitude of 0.6V, e.g. to vary between +0.6V and −0.6V, then conventionally in BTL operation, the drivers 103$p$ and 103$n$ would produce inverse driving signals, each with an amplitude of 0.3V. In embodiments of the present disclosure however, to generate an output signal magnitude of 0.6V, the driver 103$p$ may be driven to provide an output signal with a magnitude of 0.5V, i.e. a full-scale output, whilst the driver 103$n$ generates a driving signal that varies inversely with a magnitude of 0.1V.

Operating in this way thus allows for switching between modes relatively easily, as if the signal amplitude changes only relatively gradually, the changes in gain required when swapping between BTL and SE modes of operation may be relatively low.

There are various ways that the controller 201 may control the gains of the positive and negative signal paths. In some examples the controller may control the conversation gain of the drivers 103$p$ and 103$n$. Additionally, or alternatively at least some gain control may be applied by one or more gain elements 305$p$ and 305$n$ in the respective signal paths. The gain elements may, conveniently, be located in a digital part of the relevant signal paths.

In the SE mode, the driver 103$n$ may be disabled and the whole variation in the output signal Vout is driven by driver 103$p$. This improves the efficiency of the amplifier circuit and avoids any power consumption associated with driver 103$n$, for instance switching losses associated with a class-D amplifier.

In addition, in the SE mode, as the whole variation in the output signal Vout is driven by driver 103$p$, the whole load resistance RL is seen by the driver 103$p$. This is in contrast to BTL mode, where both drivers 103$p$ and 103$n$ are providing driving signals that vary with the input signal, and each driver only sees a proportion of the load resistance.

A higher effective load resistance for driver 103$p$ may be beneficial, as various performance requirements may be relaxed for higher load impedances.

Operating in SE mode for lower output signal amplitudes may therefore be advantageous as it may ease some design considerations for the driver 103$p$. Additionally, or alternatively, the operating parameters of the driver 103$p$ may be varied in use.

In particular, in some embodiments a bias supplied to the driver 103$p$ may be varied in use, for instance the magnitude of a bias current. When operating in the SE mode, in which the driver 103$p$ experiences the full load resistance, a lower bias current may be supplied to achieve a desired performance than when operating in the BTL mode.

Referring back to FIG. 3 the controller 201 may thus also be configured to control a bias source 306 so as control a bias applied to at least the driver 103$p$. In particular a lower bias current may be used in the SE mode, which provide additional power savings.

When operating in the BTL mode an increase bias may be required to achieve a desired performance. However, as discussed above the relatively contributions to the output signal Vout from the positive and negative signal paths may be unequal, unless operating at the highest output amplitudes.

In at least some applications it may be expected that relatively high amplitude output signals may be required only relatively infrequently, and thus it may be expected that for a majority of the time in normal use the required output signal may have a relatively low amplitude. Embodiments of the present disclosure thus effectively optimise the amplifier circuit for generating such lower amplitude outputs signals whilst still allowing operation to provide relatively high amplitude output signals when required.

As discussed above, in the SE mode, the voltage at the output node or terminal 104$p$ is held at the defined midpoint voltage Vmid by regulator 203.

In some implementations the midpoint voltage could be ground. For instance, if the supply voltages VH and VL are positive and negative voltages of the same magnitude, the midpoint voltage will be ground. In such a case the voltage regulator 203 may simply be a switch for selectively coupling the output node 104$n$ to ground, or some other type of ground clamp circuitry that could be activated and deactivated as required.

In some instances, however, the midpoint voltage Vmid may be a voltage level other than ground. For example, the supply voltage VH and VL could be voltages Vdd and ground respectively. In such a case the midpoint voltage may be Vdd/2 and the voltage regulator must maintain the defined voltage. The voltage regulator should advantageously be relatively power efficient.

Figure 6:
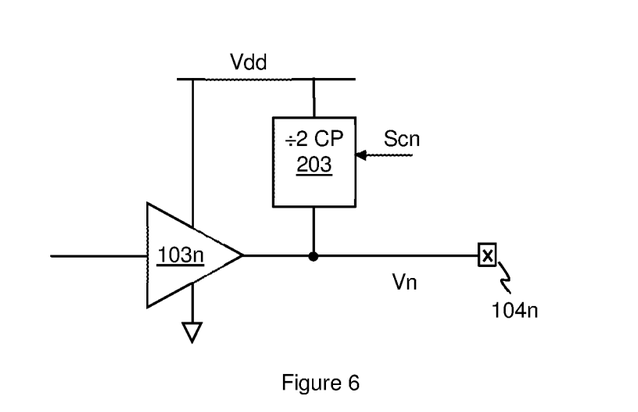
FIG. 6 illustrates one example of a suitable voltage regulator.

In some examples the voltage regulator 203 may comprise a DC-DC converter such a charge pump or the like. FIG. 6 illustrates one example where the supply voltages are Vdd and ground. In this example the voltage regulator comprises a charge pump which receives the supply voltage Vdd and which is operable to generate an output voltage of Vdd/2. There are various types of such step-down charge pump as will be understood by one skilled in the art which can efficiently generate the midpoint voltage when required. The charge pump may be activated and deactivated by a control signal Scn from the controller 201. In some embodiments the switching frequency of the charge pump may also be variable in use, and may be reduced when the indication of the output signal amplitude decreases, so as to save power.

Embodiments of the disclosure thus relate to amplifier circuitry which is selectively operable in a BTL mode to drive both sides of a load with voltages that vary in accordance with an input signal, or a SE mode of operation in which only one side of the load is driven with a varying driving voltage and the other side of the load is held at a substantially constant voltage. The amplifier circuitry may operate in the SE mode when possible and swap to the BTL mode when required to generate higher amplitude output signal. When operating in the BTL mode the driving voltages on either side of the load may, for at least some amplitudes of output signal, be asymmetric or unequal. In particular the circuit may be operable so that, when operating in the BTL mode, the relative contribution to the output signal from the driving voltage on one side of the load is reduced at lower signal amplitudes, which may be advantageous for swapping between modes.

The discussion above has described that it is the voltage at the negative output node 104n which is held constant in the SE mode and it is the contribution at the positive output node 104p which is maximised in the BTL mode. It will of course be understood that the opposite could be implemented. It will also be understood that the terms positive and negative are used simply as labels to distinguish the differential signal components and should not be taken to imply anything about the level or polarity of any voltages produced.

The description has also focused on driving audio output transducers. This may include transducers such as loudspeakers for generating audible sounds, but may also include ultrasonic or other similar transducers and/or haptic transducers. Embodiments also relate to amplifier circuits for driving other types of transducers.

Embodiments may be advantageously implemented as part of audio processing circuitry, e.g. for audio amplifiers for providing audio driving signals to audio output transducers such as loudspeakers, which may be transducers of a host device and/or transducers of an accessory apparatus which may be removably connected to the host device in use.

Embodiments may be arranged as part of an audio and/or signal processing circuit, for instance an audio circuit such as a codec which may be provided in a host device. A circuit according to an embodiment of the present invention may be implemented as an integrated circuit.

Embodiments may be incorporated in a host electronic device, which may for example be a portable device and/or a device operable with battery power. The host device could a device with one or more loudspeaker provided as part of the host device and/or a connector for making a wired connection with a loudspeaker of a removable accessory apparatus that may be removably connected to the host device in use. The host device may include a wireless communication module for receiving input data. The host device could be a communication device such as a mobile telephone or smartphone or similar, a computing device such as notebook, laptop or tablet computing device, a wearable device such as a smartwatch. The host device could alternatively be an accessory device for use with any such communication, computing or wearable device. For instance the host device could be a headset or earbud or similar The skilled person will recognise that some aspects of the above-described apparatus and methods, may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. An amplifier circuit for generating an output signal between first and second output nodes based on a received input signal, the amplifier circuit comprising:
   first and second output drivers; and
   a controller for selectively controlling the amplifier circuit in a first mode or a second mode based on an indication of output signal amplitude; wherein:
   in the first mode the first and second output drivers are both active to generate respective first and second driving signals that each vary with the input signal at the first and second output nodes respectively; and
   in the second mode the first output driver is active to generate a first driving signal at the first output node that varies with the input signal and the second output node is held at a constant voltage;
   wherein in the first mode a ratio of magnitude of the second driving signal compared to magnitude of the first driving signal varies with the indication of output signal amplitude; and
   wherein the controller is further configured to selectively control a bias applied to at least the first output driver based on the indication of the amplitude of the output signal.

2. The amplifier circuit of claim 1 wherein the controller is configured such that, when operating in the first mode, the ratio of magnitude of the second driving signal compared to magnitude of the first driving signal varies within a range from zero to one and increases with increasing indication of output signal amplitude.

3. The amplifier circuit of claim 2 wherein the controller is configured to, in the first mode, minimise the ratio of magnitude of the second driving signal compared to the magnitude of the first driving signal.

4. The amplifier circuit of claim 1 wherein the first output driver is located in a first signal path and the second output driver is located in a second signal path and wherein the controller is configured to control the ratio of magnitude of the second driving signal compared to magnitude of the first driving signal by controlling gains applied in the first and second signal paths.

5. The amplifier circuit of claim 1 wherein the indication of output signal amplitude comprises a gain setting indicating a gain to be applied by the amplifier circuit.

6. The amplifier circuit of claim 1 wherein the indication of output signal amplitude comprises an indication of amplitude of the input signal.

7. The amplifier circuit of claim 1 wherein the controller is configured such that a lower bias current is applied to the first output driver in the second mode than in the first mode.

8. The amplifier circuit of claim 1 wherein the controller is configured such that a bias current applied to the first output driver in the first mode increases with increasing output signal amplitude.

9. The amplifier circuit of claim 1 comprising a voltage regulator which is activate in the second mode to regulate the voltage at the second output node.

10. The amplifier circuit of claim 9, wherein the voltage regulator comprises at least one of: a DC-DC converter and a charge pump.

11. The amplifier circuit of claim 1 wherein the controller is configured to disable the second output driver when operating in the second mode.

12. The amplifier circuit of claim 1 wherein the first and second output drivers each comprise a respective class-D amplifier.

13. The amplifier circuit of claim 1 further comprising a load transducer coupled between the first and second output nodes.

14. The amplifier circuit of claim 13 wherein the load transducer comprises a loudspeaker.

15. An electronic device comprising the amplifier circuit of claim 1.

16. An amplifier circuit for generating an output signal between first and second output nodes based on a received input signal, the amplifier circuit comprising:
   first and second output drivers; and
   a controller for selectively controlling the amplifier circuit in a first mode or a second mode based on an indication of output signal amplitude; wherein:
   in the first mode the first and second output drivers are both active to generate respective first and second driving signals that each vary with the input signal at the first and second output nodes respectively; and
   in the second mode the first output driver is active to generate a first driving signal at the first output node that varies with the input signal and the second output node is held at a constant voltage;
   wherein in the first mode a ratio of magnitude of the second driving signal compared to magnitude of the first driving signal varies with the indication of output signal amplitude;
   wherein the controller comprises an envelope detector configured to receive a version of the input signal and determine the amplitude of the input signal; and
   wherein the indication of output signal amplitude comprises an indication of amplitude of the input signal.

17. The amplifier circuit of claim 16 wherein the amplifier circuit comprises at least one element having a propagation delay located in a signal path upstream of at least one of the first and second output drivers and wherein the envelope detector receives the version of the input signal from upstream of the delay element.

18. An amplifier circuit for generating an output signal between first and second output nodes based on a received input signal, the amplifier circuit comprising:
   first and second output drivers;
   the amplifier circuit being operable in a first mode in which the first and second output drivers are both active to generate respective first and second driving signals that each vary with the input signal at the first and second output nodes respectively;
   wherein, in the first mode, a ratio of magnitude of the second driving signal compared to magnitude of the first driving signal varies with an indication of output signal amplitude; and
   wherein the controller is further configured to selectively control a bias applied to at least the first output driver based on the indication of the output signal amplitude.

* * * * *

UNITED STATES PATENT AND TRADEMARK OFFICE
CERTIFICATE OF CORRECTION

PATENT NO. : 11,271,532 B1
APPLICATION NO. : 16/997409
DATED : March 8, 2022
INVENTOR(S) : John P. Lesso It is certified that error appears in the above-identified patent and that said Letters Patent is hereby corrected as shown below:

In the Specification

1. In Column 1, Line 54, delete "side" and insert -- sides --, therefor.

2. In Column 1, Line 56, delete "maximum" and insert -- of maximum --, therefor.

3. In Column 3, Line 11, delete "activate" and insert -- activated --, therefor.

4. In Column 3, Line 57, delete "maintain" and insert -- maintaining --, therefor.

5. In Column 4, Line 55, delete "side" and insert -- sides --, therefor.

6. In Column 5, Line 61, delete "side" and insert -- sides --, therefor.

7. In Column 6, Line 15, delete "a SE" and insert -- as SE --, therefor.

8. In Column 6, Line 32, delete "voltage regulator 202" and insert -- voltage regulator 203 --, therefor.

9. In Column 7, Line 28, delete "of the" and insert -- of --, therefor.

10. In Column 8, Line 22, delete "active" and insert -- activate --, therefor.

11. In Column 9, Line 2, delete "to" and insert -- from --, therefor.

12. In Column 10, Line 51, delete "seen the" and insert -- seen as the --, therefor.

13. In Column 11, Line 2, delete "reduce" and insert -- reduced --, therefor.

14. In Column 12, Line 4, delete "increase" and insert -- increased --, therefor.

Signed and Sealed this
Twenty-ninth Day of August, 2023

*Katherine Kelly Vidal*

Katherine Kelly Vidal
*Director of the United States Patent and Trademark Office*

CERTIFICATE OF CORRECTION (continued)
U.S. Pat. No. 11,271,532 B1

15. In Column 12, Line 6, delete "relatively" and insert -- relative --, therefor.

16. In Column 12, Line 38, delete "such a" and insert -- such as a --, therefor.

17. In Column 13, Line 32, delete "a" and insert -- be a --, therefor.

18. In Column 13, Line 44, delete "similar" and insert -- similar. --, therefor.

In the Claims

19. In Column 15, Line 65, in Claim 9, delete "activate" and insert -- activated --, therefor.